United States Patent [19]

Konishi et al.

[11] Patent Number: 4,495,650
[45] Date of Patent: Jan. 22, 1985

[54] ELECTRONIC TUNING TYPE RADIO RECEIVERS

[75] Inventors: Hideo Konishi; Kazunori Matsuoka; Takao Gouya, all of Higashihiroshima, Japan

[73] Assignee: Sharp Kabushiki Kaisha, Osaka, Japan

[21] Appl. No.: 526,222

[22] Filed: Aug. 25, 1983

Related U.S. Application Data

[60] Division of Ser. No. 330,609, Dec. 14, 1981, abandoned, which is a continuation of Ser. No. 124,852, Feb. 26, 1980, abandoned.

[30] Foreign Application Priority Data

Feb. 26, 1979 [JP] Japan .................................. 54-22404

[51] Int. Cl.³ ............................................. H04B 1/26
[52] U.S. Cl. ..................................... 455/144; 455/168; 455/190
[58] Field of Search ............................. 455/142–144, 455/168, 188, 190, 212, 218, 164

[56] References Cited

U.S. PATENT DOCUMENTS

| | | | |
|---|---|---|---|
| 2,487,772 | 11/1949 | Nicholson, Jr. et al. | 455/143 |
| 2,666,853 | 1/1954 | O'Brien | 455/143 |
| 3,334,187 | 8/1967 | Pampel | 455/168 |
| 3,382,442 | 5/1968 | Mayle | 455/168 |
| 3,575,662 | 4/1971 | Davisson | 455/168 |
| 3,584,307 | 6/1971 | Hewie | 455/168 |
| 3,800,226 | 3/1974 | Close | 455/144 |
| 3,940,697 | 2/1976 | Morgan | 455/168 |
| 4,214,212 | 7/1980 | Dipietromaria | 455/190 |

FOREIGN PATENT DOCUMENTS 45-3274 1/1980 Japan .................................. 455/168

Primary Examiner—Marc E. Bookbinder
Attorney, Agent, or Firm—Birch, Stewart, Kolasch & Birch

[57] ABSTRACT

An electronic tuning AM/FM radio receiver utilizes a common circuit for both FM reception and AM reception to stop automatically the scanning operation on the local oscillation frequency at its optimum point thus attaining simplicity of circuit structure, whereas the prior art needed a pair of complicated circuits for FM reception and AM reception. There is a local oscillator for AM reception and a second local oscillator for FM reception provided independently or commonly to each other, a control circuit provided for controlling selectively the scanning operation of the local oscillators and holding the local oscillation frequency of the selected one of the local oscillators at a scanning frequency when a tuning signal is applied, and a converter provided for converting an FM intermediate frequency into an AM intermediate frequency.

3 Claims, 2 Drawing Figures

ELECTRONIC TUNING TYPE RADIO RECEIVERS

This application is a divisional of application Ser. No. 330,609, filed on Dec. 14, 1981, now abandoned, which is a continuation of application Ser. No. 124,852, filed on Feb. 26, 1980, now abandoned.

BACKGROUND OF THE INVENTION

This invention relates generally to an electronic tuning type radio receiver having a scan control for automatically stopping the so-called local oscillation frequency scanning operation at its optimum tuning point, and more particularly to an improved electronic tuning radio receiver in which AM reception and FM reception share a common circuit for providing a tuning signal for the scan control and automatically discontinuing the scanning operation at its optimum tuning point. The conventional electronic tuning radio receiver tunable to both FM and AM broadcasting stations includes two separate local oscillators one for FM reception and the other for AM reception, each of which has a different local oscillation frequency. This is due to the fact that the intermediate frequency for FM reception is totally different from that for AM reception. For the type of radio receivers which automatically scan the local oscillation frequency, the scan rate is set at a relatively low level to enable the operator to manually stop the automatic scanning operation on the local oscillation frequency at the optimum tuning point. Radio receivers with the capability of automatically stopping the automatic scanning operation on the local oscillation frequency can accomplish a simple and quick tuning operation but needs complicated circuitry for the purpose of automatically stopping the scan operation.

It is well known that such automatic stop circuitry is adapted to take advantage of the intermediate frequency output of an intermediate frequency circuit. To this end it requires two separate automatic stop circuits for FM reception and AM reception due to the fact that the respective intermediate frequencies for FM reception and AM reception are quite different from each other, for example, 10.7 MHz and 450 KHz in Japan.

The automatic stop circuitry is very convenient for radio receivers with the capability of automatically scanning the local oscillation frequency to acheive optimum reception of any desired broadcasting station, that is, prompt, accurate and simple reception. However, such circuitry has the problems in that the circuit arrangement is complex and the two separate stop circuits should be incorporated into the radio receivers independently of each other for FM reception and AM reception. As a matter of fact, the use of the automatic stop circuitry is confined to expensive radio receivers.

OBJECTS AND SUMMARY OF THE INVENTION

It is therefore an object of the present invention to provide an improved electronic tuning type ratio receiver which is free of the prior art problems.

According to one preferred embodiment of the present invention, a local oscillator for AM reception and a second local oscillator for FM reception are provided independently or commonly to each other. A control circuit is provided for controlling selectively the scanning operation of the local oscillators and holding the local oscillation frequency of the selected one of the local oscillators at a scanning frequency when a tuning signal is applied. A converter is provided for converting an FM intermediate frequency into an AM intermediate frequency. A signal path including an AM intermediate frequency filter, an amplifier and a detector is connected to the output of the converter. One terminal of the signal path is connected to an input section of a level detector which detects the output of the converter and the output of the AM intermediate. The detectable input level of the detector is preselected at the level of input signals applied to the input section of the level detector. Output signals from the level detector are introduced as the tuning signal into the control circuit.

One of the significant features of the present invention resides in that a common circuit is utilized for both FM reception and AM reception to stop automatically the scanning operation on the local oscillation frequency at its optimum point thus attaining simplicity of circuit structure. The prior art, on the other hand, needed a pair of complicated circuits for FM reception and AM reception.

BRIEF DESCRIPTION OF THE DRAWINGS

For a more complete understanding of the present invention and for further objects and advantages thereof, reference is now made to the following description taken in conjunction with the accompanying drawings, in which.

DETAILED DESCRIPTION OF PREFERRED EMBODIMENTS

Figure 1:
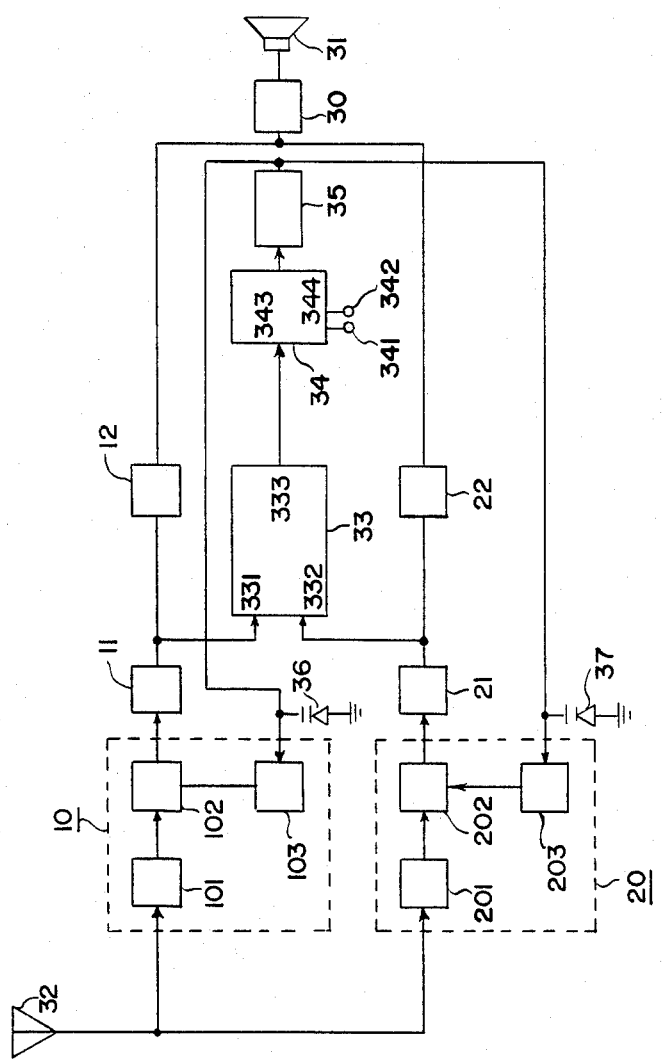
FIG. 1 is a systematic block diagram of a radio receiver constructed in accordance with the present invention.

Referring first to FIG. 1, there is illustrated a systematic block diagram of a radio receiver embodying the present invention, which comprises an FM front stage 10 and an AM front stage 20, the former including an RF amplifier 101, a mixer 102 and a local oscillator 103 and the latter including similarly an RF amplifier 201, a mixer 202 and a local oscillator 203.

An FM intermediate frequency amplifier 11 and an AM intermediate frequency amplifier 21 follow the FM front stage 10 and the AM front stage 20, respectively. An FM detector 12 and an AM detector 22 are connected between the outputs of the amplifiers 11 and 21 and a series combination of a low frequency amplifier 30 and a loud speaker 31, respectively. In other words, when any FM or AM broadcasting signal is received by an antenna 32, that received signal is converted into the FM intermediate frequency of or the AM intermediate frequency via the FM front stage 10 or the AM front stage 20.

If one of two receiver modes is selected by an AM reception mode/FM reception mode selector, then either the FM intermediate frequency output or the AM intermediate frequency output will be derived from the intermediate frequency amplifier 11 or 21. After the derived intermediate frequency output is amplified by the low frequency amplifier 30 via the detector 12 or 13, the loud speaker 31 is enabled to deliver audible sounds of any selected FM or AM broadcasting signals.

A first control circuit 33, the heart of the present invention, is adapted to develop a tuning instruction for discontinuing the scanning operation. Two input sections 331 and 332 of the first control circuit 33 are connected to the outputs of the FM intermediate amplifier 11 and the AM intermediate amplifier 21 so that either the FM intermediate frequency (10.7 MHz) or the AM intermediate frequency (450 KHz) is supplied to the input section 331 or 332 of the first control circuit 33 thus permitting the tuning instruction to be delivered from an output section 333.

The tuning instruction is applied to an input section 343 of a second control circuit 34 implemented with a recently developed microprocessor technique which is responsive to input data applied to its input data sections 341, 342, etc., for governing the start and end points, direction and speed of the scanning operation. An output section 344 of the second control circuit 34 is connected to an input section of a PLL (phase locked loop) circuit 35. As is well known in the art, the PLL circuit 35 includes a crystal standard oscillator, a phase comparator, a low pass filter, a direct current amplifier, a voltage-controlled oscillator and so forth in a loop configuration, in which case the voltage-controlled oscillator may additionally include the above mentioned local oscillators 103 and 203 and variable capacitors 36 and 37 differently from the above shown illustration. Although the two separate local oscillators 103 and 203 are shown, the single voltage-controlled oscillator in the PLL circuit may replace these two local oscillators.

While the second control circuit 34 is controlling the local oscillation frequency of the local oscillator 103 or 203, that is, the scanning direction and the speed of the oscillation frequency of the voltage-controlled oscillator, either of the two intermediate frequency outputs from the intermediate amplifier 11 or 21 is supplied to the input section 331 or 332 of the first control circuit 33 during the selected one of the two receiver modes so that the tuning instruction is derived from the output section 333 of the first control circuit 33 and fed to a latch circuit (not shown) contained within the PLL circuit 35. The latch circuit may comprise a well known shift register and operate the PLL circuit 35 if the output of the first control circuit 33 includes any signals other than the tuning instruction signal which is representative of the scanning direction and speed. Simultaneously to the application of the tuning instruction, the shift register stores and circulates the tuning instruction and keeps constant the oscillation frequency of either the voltage-controlled oscillator within the PLL circuit or the local oscillators 103 or 203. Since the scanning operation comes to a stop under these circumstances, the intermediate frequency amplifier 11 or 21 continues supplying the instantaneous intermediate frequency to enable the operator to listen to a desired one of FM and AM broadcasting stations.

Figure 2:
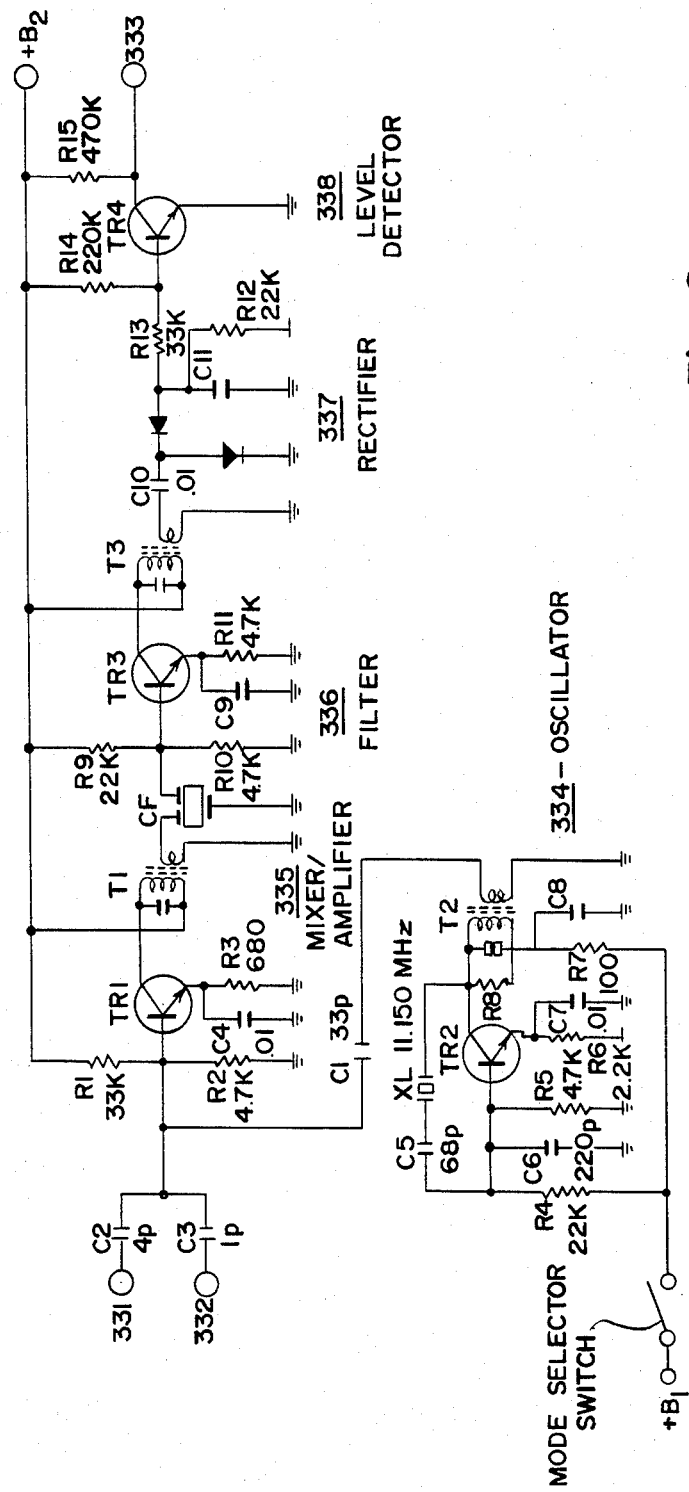
FIG. 2 is a detailed circuit diagram showing a control circuit contained within the radio receiver of FIG. 1.

FIG. 2 details the inside circuit arrangement of the first control circuit 33.

It is clear from FIG. 1, that the output section of the first control circuit 33 is single and common to FM reception and AM reception for automatically stopping the scanning operation. The first control circuit 33 which makes this possible is a principal component for the purpose of the present invention. Referring to FIG. 2, the first control circuit 33 particularly includes an oscillator 334, a mixer/amplifier 335, a filter 336 of the normal AM intermediate frequency or its equivalent frequency, a rectifier 337 and a level detector 338. When the FM/AM receiver mode selector switch is turned to the FM receiver mode, the oscillator 334 is supplied with a DC enable voltage from a power supply line $+B_1$ and its oscillation frequency is fixed at 11.150 MHz or 10.250 MHz with a quartz piezo-electric transducer XL.

The oscillator 334 is connected to an FM intermediate frequency input terminal 331 via a secondary coiling $l_1$ of an output transformer $T_2$, a capacitor $C_1$ and another capacitor $C_2$. When the oscillator 334 oscillates with the enable voltage from the line $+B_1$ during the FM receiver mode, and when the FM intermediate frequency of 10.7 MHz is applied to the input section 331, it is then converted into 11.150-10.7 (in MHz)=450 (in KHz) or 10.7-10.25 (in MHz)=450 (in KHz). In other words, the oscillation frequency of the oscillator 334 is intermingled with the FM intermediate frequency at the joint of the capacitors $C_1$ and $C_2$. During the FM receiver mode the mixer/amplifier 335 serves as a converter with respect to the FM intermediate frequency and converts the FM intermediate frequency into an AM equivalent. The next succeeding filter 336 having a band width of ±6 KHz centering 450 KHz decides the accuracy of the tuning instruction. The resulting equivalent AM intermediate frequency is amplified via the filter 336 and rectified via the next succeeding rectifier 337. The band width ±6 KHz of the filter 336 is enough to achieve the optimum tuning operation since at least 50 KHz is allotted between two adjacent broadcasting stations pursuant to the Radio Law in Europe.

The equivalent AM intermediate frequency outputted from the rectifier circuit 337 inverts the operating state of the level detector 338 consisting of a conventional switching circuit such as a schmitt trigger circuit. In other words, when no FM intermediate frequency is applied to the input terminal 331 or when no AM intermediate frequency is applied to the other input terminal 332, a transistor Tr4 within the level detector 338 is biased with a power supply voltage $+B_2$ and placed in the conductive state with its collector electrode at the ground potential.

When the output section 333 of the first control circuit 33 is held at the ground potential, the latch circuit contained within the PLL circuit 35 does not operate and the local oscillator continues executing the scanning operation. Thereafter, if the equivalent AM intermediate frequency is applied to the rectifier circuit 337, then the transistor Tr4 within the level detector 338 changes from the conductive state to the nonconductive one with its collector voltage increasing to a high level. At this moment the output section 333 of the fine control circuit 33 is maintained at a high level so that the latch circuit in the PLL circuit 35 operates in the above described manner to automatically stop the scanning operation by the local oscillator.

When the receiver is turned to the AM receiver stage, no DC operating voltage $+B_1$ is supplied to the oscillator 334 within the first control circuit 33 which in turn is in the disabled state. Upon the subsequent application of the AM intermediate frequency output to the other input section 332 of the control circuit 33 this AM intermediate frequency output is amplified by the mixer/amplifier 335. While the circuit 335 may serves as a mixer during the FM receiver mode, it actually serves as an AM intermediate frequency amplifier at this time because the oscillator 334 is not active.

The AM intermediate frequency enables the level detector 338 via the amplifier 335 using the same path as does the AM equivalent intermediate frequency to deliver the tuning instruction.

As an alternative, the AM intermediate frequency may be supplied directly to the filter amplifying stage for the development of the tuning instruction. In this case the amplifying stage may include the AM intermediate frequency circuit 21.

It is appreciated that the present invention is of significant advantages to small sized receivers such as car radio receivers, radio receivers and combined car radio receiver and cassette tape recorders.

Whereas the present invention has been described with respect to specific embodiments thereof, it will be understood that various changes and modifications will be suggested to one skilled in the art, and it is intended to emcompass such changes and modifications as fall within the scope of the appended claims.

We claim:

1. A control circuit for detecting amplitude levels of either an AM intermediate frequency (IF) or an FM intermediate frequency (IF) signal and generating a control output signal therefrom when either said AM intermediate frequency signal or FM intermediate frequency signal exceeds a predetermined amplitude level comprising:

mode selector means for setting said control circuit in either an AM detection mode for detecting the level of an AM IF signal or an FM detection mode for detecting the level of an FM IF signal;

input terminal means responsive to said mode selector means for receiving either said AM IF signal in said AM detection mode or said FM IF signal in said FM detection mode;

oscillator means responsive to said mode selector means for generating an oscillating voltage output signal of a selected frequency when said mode selector switch is set in said FM detection mode;

mixer/amplifier means coupled to said input terminal means and an output of said oscillator means for mixing the FM IF signal at said input terminal means with said oscillating voltage output signal of said oscillator means to create a modified FM signal in the frequency range of said AM IF signal and amplifying either said AM IF signal or said modified FM signal; and level detector means for measuring the amplitude level of said AM IF signal when said mode selector means is in said AM detection mode and the amplitude level of said modified FM signal when said mode selector means is in said FM detection mode, and generating said control output signal when either amplitude level exceeds a predetermined level.

2. The control circuit of claim 1 further comprising: filter means coupled between the output of said mixer/amplifier means and said level detector means for passing only signals output from said mixer/amplifier means in said AM intermediate frequency range.

3. The control circuit of claim 2 further comprising: rectifier means connected between said filter means and said level detector means for rectifying signals passed by said filter means.

* * * * *